United States Patent [19]

Choi

[11] Patent Number: 5,658,695
[45] Date of Patent: Aug. 19, 1997

[54] METHOD FOR FABRICATING PHASE SHIFT MASK COMPRISING THE USE OF A SECOND PHOTOSHIELD LAYER AS A SIDEWALL

[75] Inventor: Yong Kyoo Choi, Seoul, Rep. of Korea

[73] Assignee: Goldstar Electron Co., Ltd., Chungcheongbuk-do, Rep. of Korea

[21] Appl. No.: 463,244

[22] Filed: Jun. 5, 1995

[30] Foreign Application Priority Data

Jun. 21, 1994 [KR] Rep. of Korea ............... 14034/1994

[51] Int. Cl.$^6$ ............................................. G03F 9/00
[52] U.S. Cl. ........................ 430/5; 430/322; 430/324
[58] Field of Search ........................... 430/5, 311, 322, 430/324

[56] References Cited

U.S. PATENT DOCUMENTS 5,382,483  1/1995  Young ................................. 430/5

FOREIGN PATENT DOCUMENTS 2383534  8/1990  European Pat. Off. .

OTHER PUBLICATIONS

"Improving Resolution in Photolithography with a Phase-Shifting Mask," Levenson, et al., IEEE, vol.Ed. 29 No. 12, Dec. 1982, pp. 1828–1826.

Primary Examiner—S. Rosasco

[57] ABSTRACT

A method is provided for fabricating a phase shift mask of the out rigger sub-resolution type capable of accurately fabricating an ultra-fine semiconductor circuit. The method includes the steps of depositing a first photoshield metal layer and a first phase shift material layer over a transparent substrate, defining a transmission region for forming an actual pattern and a sub-pattern region for the transmission region, and removing portions of the photoshield metal layer and phase shift material layer disposed at the defined regions, depositing a second phase shift material layer over the resulting structure, and selectively etching back the second phase shift material layer to form phase shift material side walls, depositing over the resulting structure a photoresist film, and etching back the optional material layer such that both the first and second phase shift material layers are sufficiently exposed at their upper surfaces, etching back the first and second phase shift material layers such that they are flush with the first photoshield metal layer to form a phase shift layer at the sub-pattern region, and depositing a second photoshield material layer over the resulting structure, and etching back the second photoshield material layer to form second photoshield material side walls on the phase shift layer side walls.

18 Claims, 10 Drawing Sheets

METHOD FOR FABRICATING PHASE SHIFT MASK COMPRISING THE USE OF A SECOND PHOTOSHIELD LAYER AS A SIDEWALL

BACKGROUND OF THE INVENTION

The present invention relates to a phase shift mask, and more particularly to a method for fabricating a phase shift mask appropriately usable for fabrication of an ultra-fine semiconductor circuit structure.

Recently, semiconductor devices have been developed to exhibit a higher integration degree and a higher package density. In order to fabricate such semiconductor devices, a photomask having a more fine line width has been used. Otherwise, specific modified fabrication techniques have been proposed.

Generally, photolithography is the technique for forming an image pattern by transmitting light of a certain wavelength such as ultraviolet rays to the surface of a photoresist coated on a semiconductor substrate through a photomask. A photomask of the general type includes a photoshield pattern and a transmission pattern to achieve a selective light exposure. When such a photomask has an increased pattern density, a diffraction phenomenon may occur. For this reason, the photomask has a limitation on an improvement in resolution. This will be described in more detail.

Resolution and depth of focus obtained when a light exposure is carried out using the general type photomask can be expressed by the following equations (1) and (2):

$$R = k_1 \lambda / NA \qquad (1)$$

where, R represents the resolution, $k_1$ represents a proportional constant, $\lambda$ represents a wavelength of source light used for the light exposure, and NA represents a numerical aperture, $$D.O.F. = k_2 \lambda / (NA)^2 \qquad (2)$$

where, $k_2$ represents a proportional constant and D.O.F. represents the depth of focus.

As the size of patterns is smaller, amplitudes of light on the wafer may be more difficult to be distinguished from one another because the difference between the crest and valley thereof is smaller due to a light diffraction occurring in adjacent patterns, as shown in FIGS. 1a to 1d. For this reason, there has been extensive research for improving the resolution by use of the phase shift lithography.

The phase shift lithography is the technique using a combination of a general transmission region adapted to transmit ejected light without any interference and an 180°-phase-shifted transmission region made of a phase shift material, as each transmission pattern disposed between adjacent photoshield patterns. This technique can reduce the light diffraction problem because each photoshield pattern region generates a diffraction offset to that of each transmission pattern region adjacent thereto.

Accordingly, it is possible to form a pattern image similar to the mask image by sharply modulating the intensity of light. In order to transfer patterns exhibiting a high complexity, various lithography techniques have been developed.

As the phase shift mask, a Levenson type mask including a transmission film provided at one of neighboring transmission regions and adapted to shift the phase of light, and an edge emphasis type mask adapted to achieve a phase shift at edges of two different transmission regions have been used to reduce the photo-sensitivity.

Now, examples of conventional phase shift masks will be described, in conjunction with FIGS. 2a to 2h and FIGS. 3a to 3g.

FIGS. 2a to 2h are sectional views respectively illustrating fabrication of a conventional edge emphasis type phase shift mask.

In accordance with the illustrated fabrication method, a chromium layer 2 as a photoshield metal layer is first deposited over a transparent substrate 1, as shown in FIG. 2a. Over the chromium layer 2, a first photoresist film 3 is deposited.

Thereafter, photoshield pattern regions are defined at the first photoresist film 3 by selectively exposing the first photoresist film 3 to electron beams, as shown in FIG. 2b. The chromium layer 2 is then selectively removed such that only its portions respectively disposed at the photoshield pattern regions remain, as shown in FIG. 2c.

As shown in FIG. 2d, the remaining portions of the first photoresist film 3 are completely removed. Over the entire exposed surface of the resulting structure, a second photoresist film 4 is then deposited to a predetermined large thickness. Thereafter, the resulting structure is subjected to a back light exposure at the lower surface of the substrate 1 and then to a development, thereby causing the second photoresist film 4 to be patterned such that only its portions each disposed between adjacent photoshield pattern regions remain, as shown in FIG. 2e.

As shown in FIG. 2f, a phase shift layer 5 including, for example, a silicon oxide film is deposited over the entire exposed surface of the resulting structure. The phase shift layer 5 has a discontinuous structure because the patterned second photoresist film 4 has a large thickness.

Subsequently, the remaining portions of the second photoresist film 4 and portions of the phase shift layer 5 disposed over the remaining portions of the second photoresist film 1 are selectively removed by use of a lift-off process, as shown in FIG. 2g.

Using a wet etch process, the remaining portions of the chromium layer 2 respectively disposed at the photoshield regions are then over-etched, as shown in FIG. 2h.

On the other hand, FIGS. 3a to 3g are sectional views respectively illustrating fabrication of a conventional phase shift mask of the spatial frequency modulation type. In FIGS. 3a to 3g, elements corresponding to those in FIGS. 2a to 2h are denoted by the same reference numerals.

In accordance with the fabrication method, a chromium layer 2 and a first photoresist film 3 are sequentially deposited over a transparent substrate 1, as shown in FIG. 3a. The first photoresist film 3 is selectively exposed to electron beams at its portions corresponding to transmission regions and then subjected to development. That is, the first photoresist film 3 is patterned such that its portions respectively disposed at the transmission regions remain, as shown in FIG. 3b.

Using the patterned first photoresist film 3 as a mask, the exposed portions of chromium layer 2 are selectively removed, as shown in FIG. 3c.

Thereafter, the remaining portions of the first photoresist film 3 are completely removed, as shown in FIG. 3d. Over the entire exposed surface of the resulting structure, a second photoresist film 4 is thickly coated. Subsequently, the second photoresist film 4 is selectively exposed to electron beams at its portions respectively corresponding to the transmission regions. In this case, the electron beam exposure is not carried out for all the transmission regions, but the electron beam exposure is carried out for every other transmission region.

The second photoresist film 4 is then subjected to development, thereby removing its portions exposed to the electron beams, as shown in FIG. 3e.

Over the entire exposed surface of the resulting structure, a phase shift layer 5 including, for example, a silicon oxide ($SiO_2$) film is deposited, as shown in FIG. 3f. Similar to the case of FIGS. 2a to 2h, the phase shift layer 5 has a discontinuous structure because the patterned second photoresist film 4 is so thickly deposited as to form high steps.

Subsequently, the remaining portions of the second photoresist film 4 and portions of the phase shift layer 5 disposed over the remaining portions of the second photoresist film 4 are selectively removed by use of the lift-off process, as shown in FIG. 3g. Thus, a phase shift mask of the spatial frequency modulation type is obtained.

The conventional phase shift mask of the edge emphasis type achieves a phase shift at edges of photoshield patterns whereas the conventional phase shift mask of the spatial frequency modulation type achieves a phase shift at one of the neighboring transmission regions.

FIG. 4 is a plan view illustrating the layout of a conventional phase shift mask of the outrigger sub-resolution type. As shown in FIG. 4, this phase shift mask has fine sub-patterns B and B' disposed in the vicinity of or around each transmission region A at which an actual pattern is to be formed. The fine sub-patterns B and B' serve to prevent an interference phenomenon occurring due to a light diffraction generated in a light exposure.

Fabrication of this phase shift mask of the outrigger sub-resolution type will now be described.

For preventing the interference phenomenon occurring due to the light diffraction by use of the sub-patterns, the width ratio between the transmission region A corresponding to the actual pattern and the fine sub-patterns B and B' disposed around the transmission region A should be 3:1. Also, each of photoshield regions C and C' respectively disposed between the transmission region A and the fine sub-pattern B' should have the same width as the transmission region A. Therefore, the width ratio among the regions B', C', A, C and B must be 1:3:3:3:1. At this width ratio, an optical characteristic can be obtained for offsetting the light diffraction generated at edges of each transmission region A corresponding to the actual pattern.

In a typical fabrication of such a phase shift mask of the outrigger sub-resolution type, each fine sub-pattern is formed to have the width of about 0.15 μm when the transmission region at which the actual pattern is to be formed has the width of about 0.4 μm. Since the pattern width is very small as mentioned above, patterning of the sub-fine patterns should be carried out using electron beams.

In order to fabricate the phase shift mask, a chromium layer as a photoshield layer and a photoresist film for electron beams are deposited over a transparent glass substrate. Thereafter, electron beams are selectively ejected onto each transmission region A at which an actual pattern is to be formed and each of fine sub-patterns B and B' disposed in the vicinity of the transmission region A. The photoresist film is then subjected to a development to define transmission regions. Using the photoresist film as a mask, the chromium layer is selectively removed, thereby forming a phase shift mask of the outrigger sub-resolution type.

However, the above-mentioned phase shift masks have the following problems.

First, in the case of the phase shift mask of the edge emphasis type, an under-cut phenomenon occurs upon isotropically wet etching edges of photoshield regions. As a result, it is difficult to expect an accurate phase shift effect.

Second, it is difficult to correct a defect generated at a mask because the patterns of the phase shift layer and photoshield metal layer formed on the transparent substrate have a reverse critical dimension structure.

Third, although the phase shift mask of the spatial frequency modulation type provides a better phase shift effect over the phase shift mask of the edge emphasis type, it requires a more complex process involving an additional photomasking step because phase shift layers are selectively formed in transmission regions.

Fourth, in the case of the phase shift mask of the outrigger sub-resolution type, the regions B', C', A, C and B including each transmission region A at which an actual pattern is to be formed, fine sub-patterns B and B' respectively disposed in opposite sides of the transmission region A, and photoshield regions C and C' respectively disposed between the transmission region A and the fine sub-pattern B and between the transmission region A and the fine sub-pattern B' must have a certain width ratio of, for example, 1:3:3:3:1. However, it is difficult to accurately obtain the pattern width ratio because attraction or repulsion occurs among electrons charged up in the photoresist film for electron beams upon the electron beam exposure, due to the small pattern width. Furthermore, there are disadvantages of an increased manufacture cost and a degraded yield.

SUMMARY OF THE INVENTION

Therefore, an object of the invention is to solve the above-mentioned problems and, thus, to provide a phase shift mask of the outrigger sub-resolution type capable of fabricating an ultra-fine semiconductor circuit by accurately controlling the pattern width by the deposition thickness without using electron beams.

In accordance with an embodiment of the present invention, this object can be accomplished by providing a method for fabricating a phase shift mask, comprising the steps of: patterning a first photoshield layer on a substrate; depositing a phase layer over said substrate; patterning said phase shift layer to form side wall phase shift spacers at edges of said first photoshield layer; and depositing a second photoshield layer over said first photoshield layer, said phase shift layer and said substrate to form side wall photoshield spacers.

The method of the present embodiment simplifies the fabrication process by eliminating masking steps in forming the phase shift layer. Also, this method more precisely patterns the width ratios necessary for the phase shift mask when forming fine patterns in semiconductor circuits.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Other objects and aspects of the invention will become apparent from the following description of embodiments with reference to the accompanying drawings in which:

FIGS. 1a to 1d explain amplitude and intensity of light passing through a mask having the general type structure shown in FIG. 1a;

DETAILED DESCRIPTION OF THE PREFERRED EMBODIMENTS

Figure 1A:
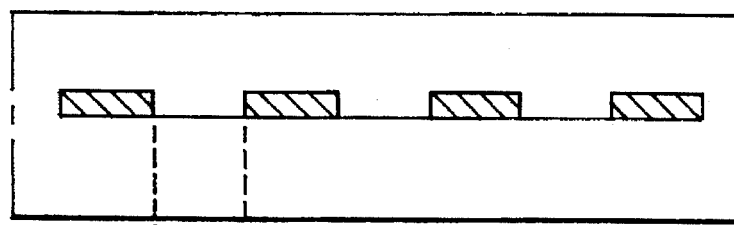
Figure 1B:
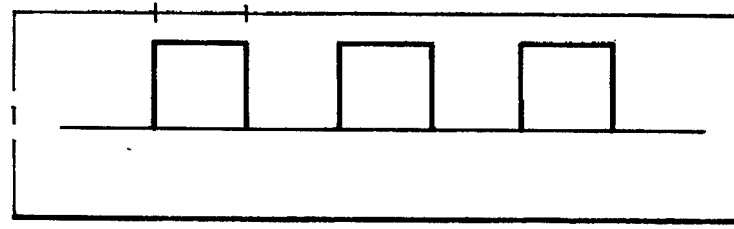
Figure 1C:
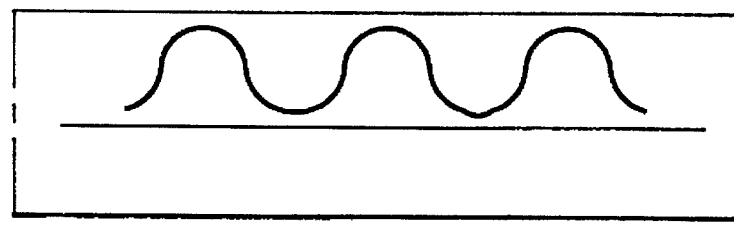
Figure 1D:
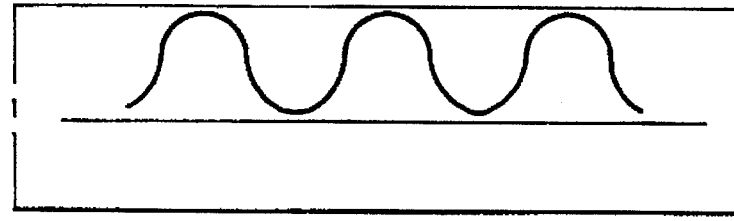
Figure 2A:
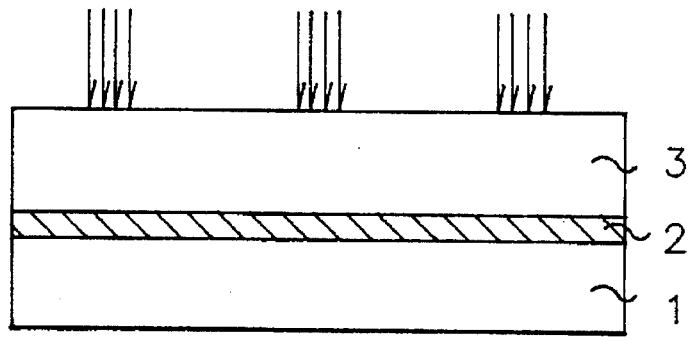
FIGS. 2a to 2h are sectional views respectively illustrating fabrication of a conventional edge emphasis type phase shift mask.
Figure 2B:
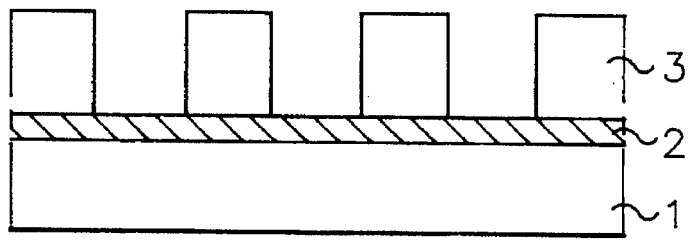
Figure 2C:
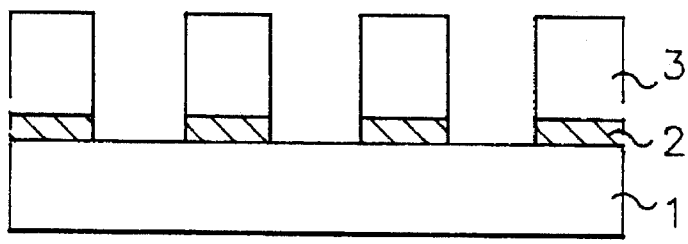
Figure 2D:
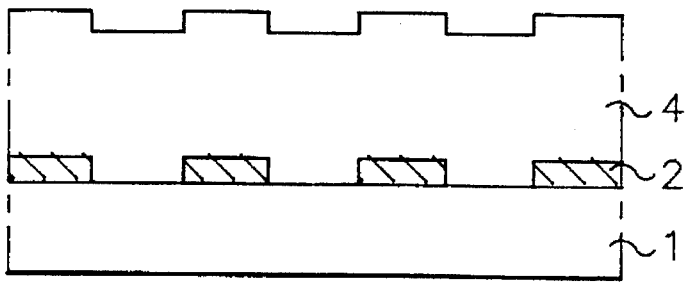
Figure 2E:
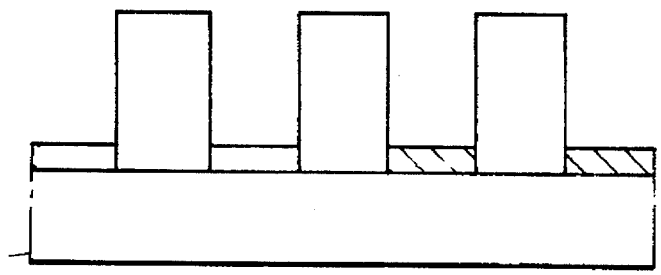
Figure 2F:
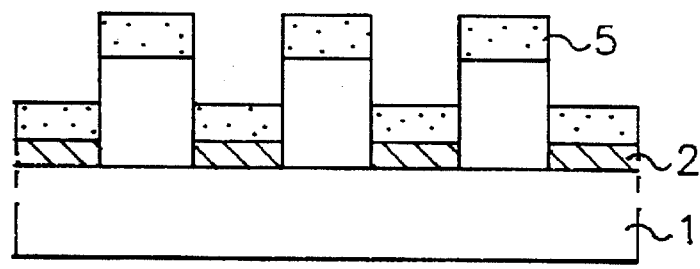
Figure 2G:
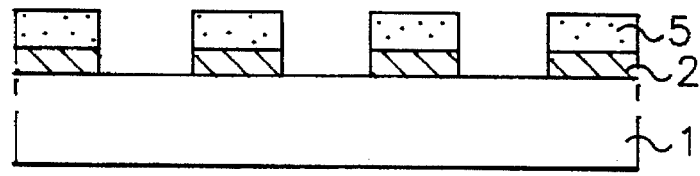
Figure 2H:
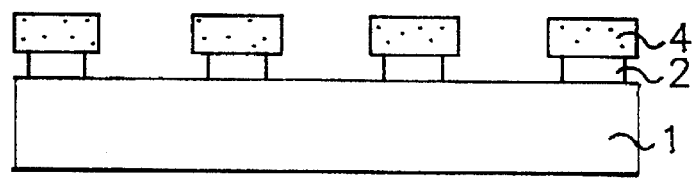
Figure 3A:
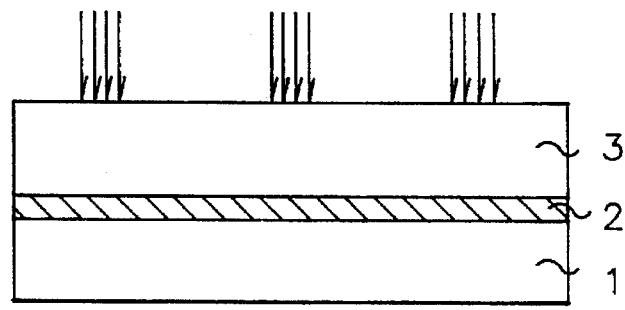
FIGS. 3a to 3g are sectional views respectively illustrating fabrication of a conventional phase shift mask of the spatial frequency modulation type.
Figure 3B:
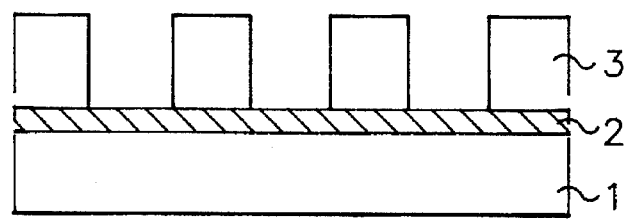
Figure 3C:
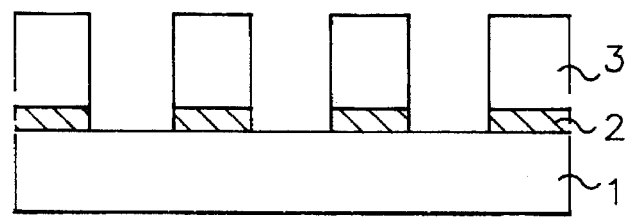
Figure 3D:
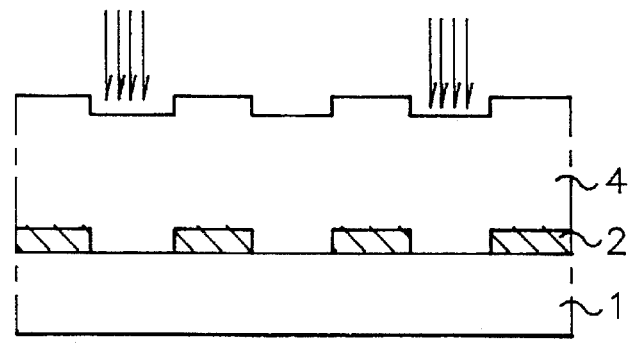
Figure 3E:
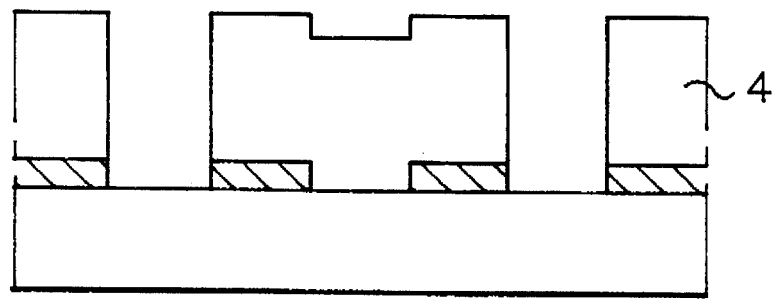
Figure 3F:
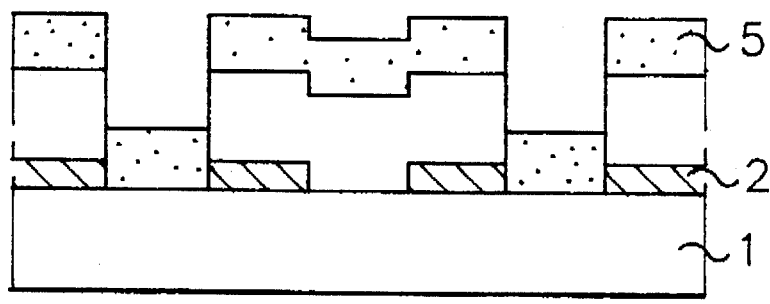
Figure 3G:
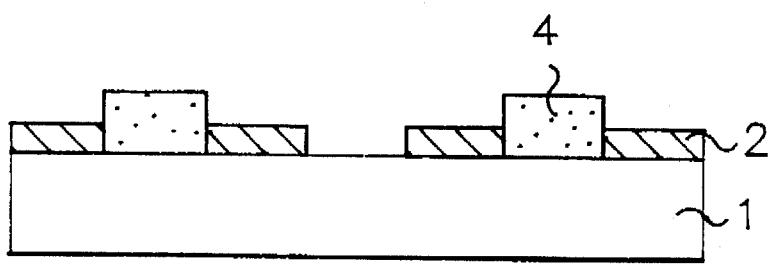
Figure 4:
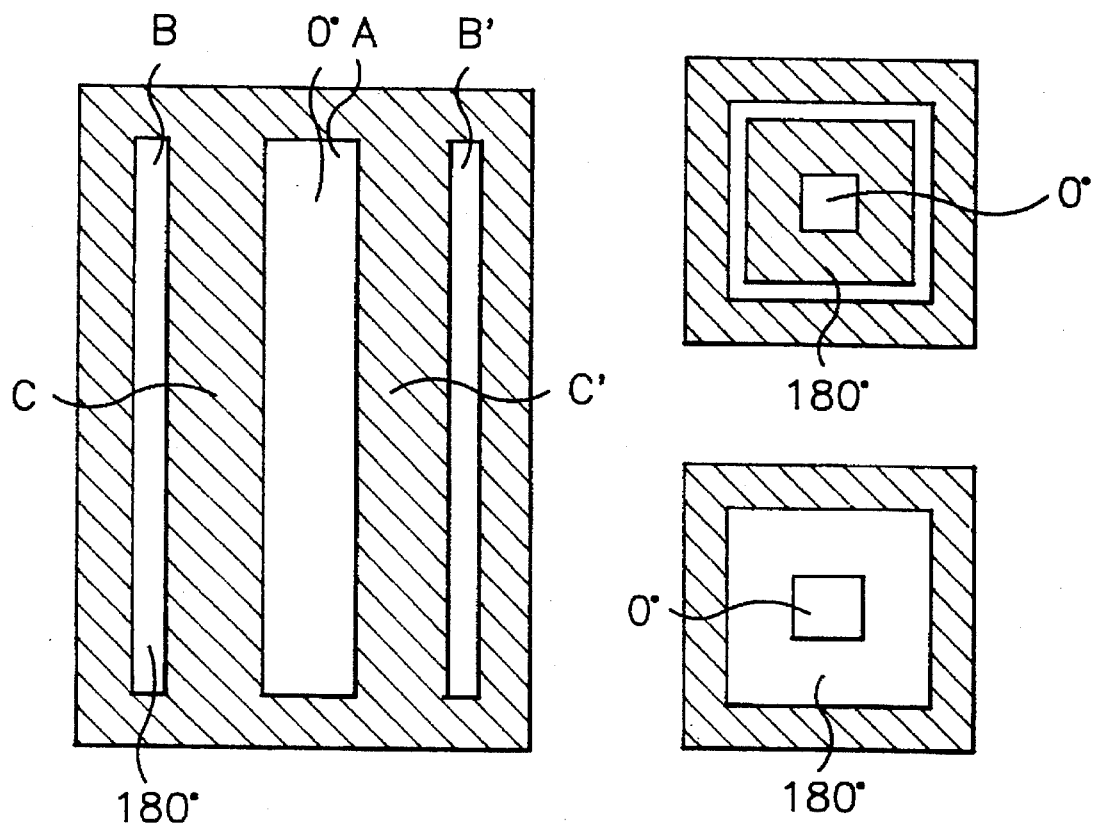
FIG. 4 is a plan view illustrating the layout of a conventional phase shift mask of the out rigger sub-resolution type.

FIGS. 5a to 5e are sectional views respectively illustrating a method for fabricating a phase shift mask in accordance with an embodiment of the present invention. FIG. 6 is a plan view of the phase shift mask fabricated in accordance with a method for an embodiment of the present invention.

In accordance with the method of the present embodiment, a transparent substrate 11 made of glass or quartz is prepared. Over the transparent substrate 11, a chromium layer as a first photoshield layer 12, a first optional layer 13 (such as a phase shift layer having the same etch rate as a subsequently formed phase shift layer 15, for example) and a photoresist film 14 are sequentially formed.

The height (thickness) of the chromium layer 12 is determined based on the subsequently formed phase shift layer 15. That is, when the refractive index of the phase shift layer 15 is n and the wavelength of light used in light exposure is $\lambda$, the height d is given by the following equation (3):

$$d=\lambda/2(n-1) \qquad (3)$$

Accordingly, the formation of the chromium layer 12 is carried out while adjusting the height of the chromium layer 12 by use of the equation (3).

Figure 5A:
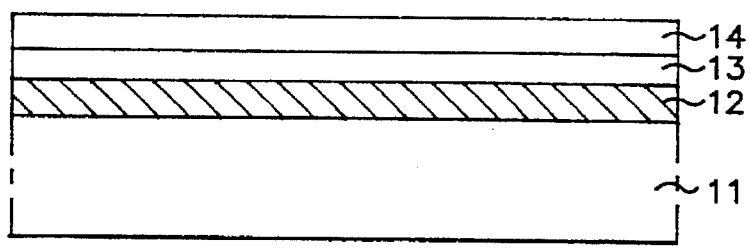
FIGS. 5a to 5h sectional views respectively illustrating a method for fabricating a phase shift mask in accordance with an embodiment of the present invention.
Figure 5B:
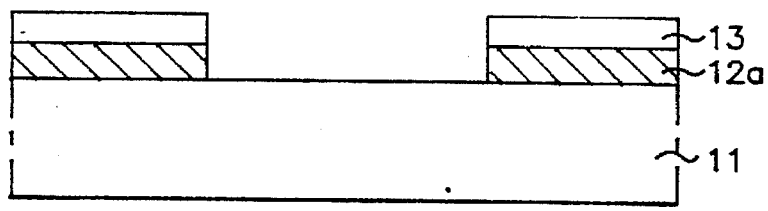
Figure 6:
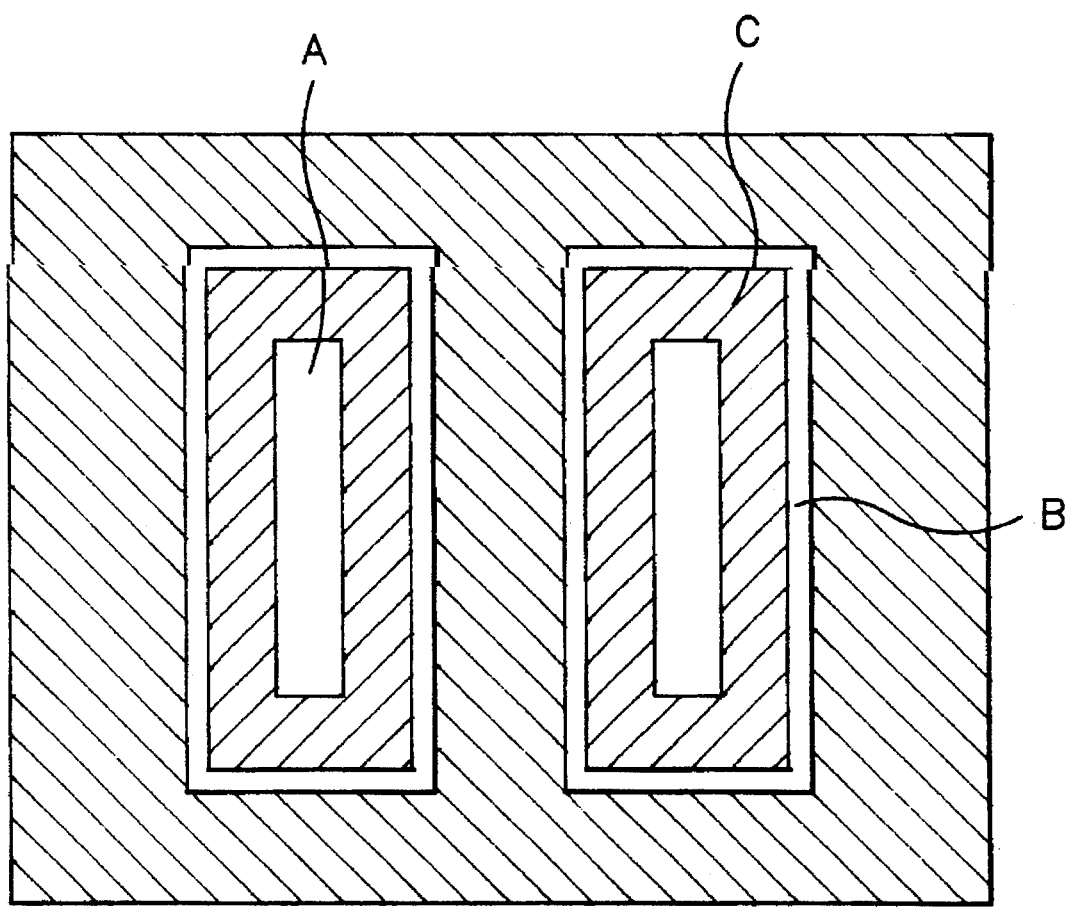
FIG. 6 is a plan view of the phase shift mask fabricated in accordance with a method for an embodiment of the present invention.

Thereafter, formation of a photoshield chromium pattern 12a is carried out, as shown in FIG. 5b. The photoshield chromium pattern 12a is formed by defining a region including a transmission region A for forming an actual pattern, fine sub-patterns B and B' disposed in the vicinity of the transmission region A, and photoshield regions C and C' respectively disposed between the transmission region A and the fine sub-pattern B and the transmission region A and the fine sub-pattern B' in the photoresist film 14 and then selectively removing the chromium layer 12 and the first optional layer 13 at their portions disposed in the defined region.

Figure 5C:
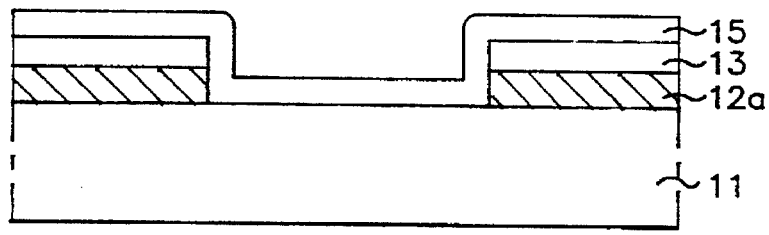

Over the entire exposed surface of the resulting structure after removing the remaining portion of the photoresist film 14, the phase shift layer 15 is deposited, as shown in FIG. 5c. At this time, the phase shift layer 15 has a uniform thickness corresponding to the width of the sub-patterns B and B'.

Figure 5D:
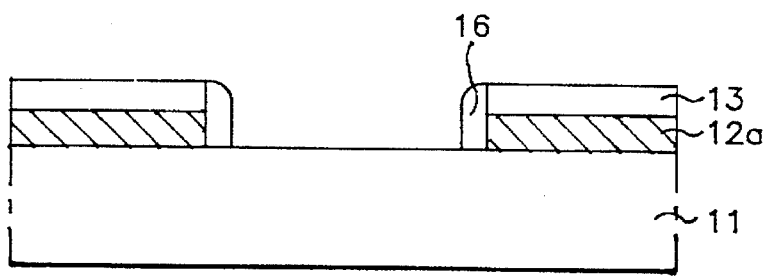

Subsequently, the phase shift layer 15 is etched using an isotropic etch process such as an ion milling process or a reactive ion etching (RIE) process, thereby forming phase shift side walls 16 on side surfaces of the chromium pattern 12a and the first optional layer 13 as shown in FIG. 5d.

Figure 5E:
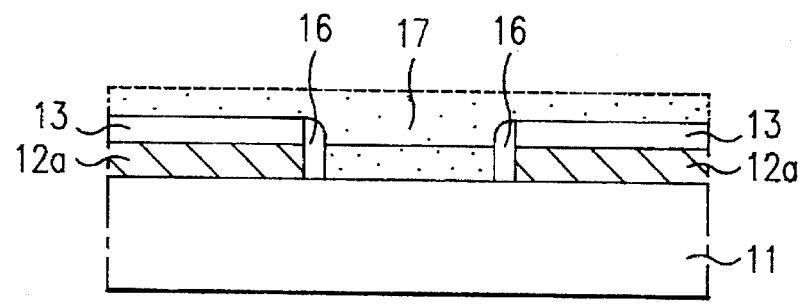

Over the entire exposed surface of the resulting structure, a second optional layer 17 (such as a photoresist film, for example) having a planarized surface is deposited which exhibits a higher etch selectivity than etch selectivities of the first optional layer 13 and the phase shift layer 15, as shown in FIG. 5e.

Thereafter, the second optional layer 17 is etched back using an isotropic etching process such as the RIE process so that the first optional layer 13 and the phase shift side walls 16 can be sufficiently exposed. The remaining second optional layer 17 is flush with the chromium pattern 12a.

Figure 5F:
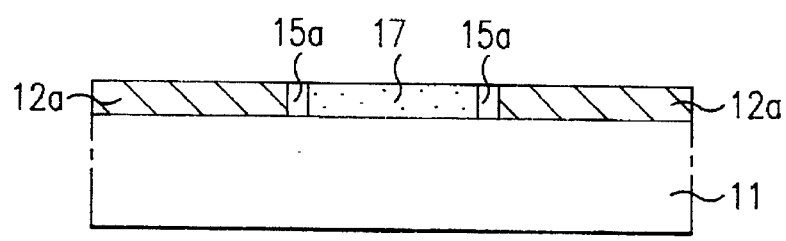

Using the second optional layer 17 as a mask, the first optional layer 13, the phase shift layer 15 and the phase shift side walls 16 are then etched back using an isotropic etching process such as the reactive ion etching process, as shown in FIG. 5f. As a result, phase shift layers 15a flush with the chromium pattern 12a are formed at the sub-pattern regions B and B', respectively.

Figure 5G:
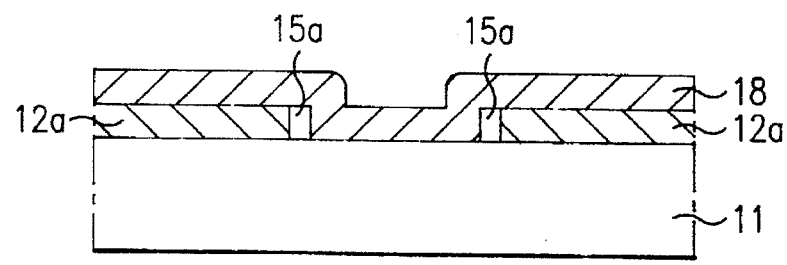

Over the entire exposed surface of the resulting structure, a second photoshield material layer 18 is then deposited, as shown in FIG. 5g. The deposition of the second photoshield material layer 18 is achieved by depositing metal such as tungsten or amorphous silicon by use of a low pressure chemical vapor deposition process. The thickness of the second photoshield material layer 18 is determined, depending on the wavelength $\lambda$ of light used for the light exposure and the dimension of the photoshield regions C and C'. In other words, the thickness of the second photoshield material layer 18 is adjusted so as to accurately obtain required widths of the transmission region A and the photoshield regions C and C' and achieve a sufficient phase shift at the phase shift layers 15a and the pattern regions when an anisotropical etch is subsequently carried out.

Figure 5H:
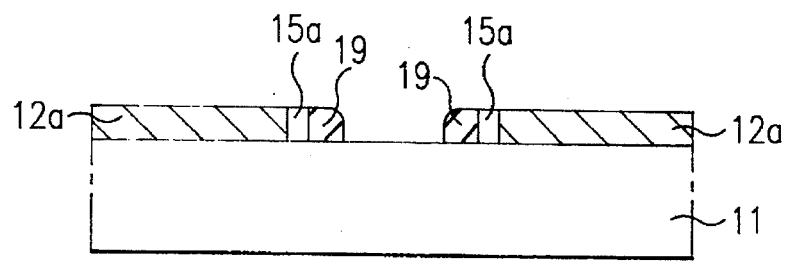

Thereafter, the second photoshield material layer 18 is etched back using the anisotropic etch process such as the ion milling process or the RIE process, as shown in FIG. 5h. As a result, photoshield material side walls 19 are formed on the phase shift layers 15a, respectively.

Thus, a phase shift mask in accordance with the present embodiment is obtained, as shown in FIG. 6.

As shown in FIG. 6, the phase shift mask has a structure obtained by primarily defining a region including the transmission region A for forming the actual pattern, the fine sub-patterns B and B' disposed around the transmission region A, and the photoshield regions C and C' respectively disposed between the transmission region A and the fine sub-pattern B and the transmission region A and the fine sub-pattern B'. The structure also includes the chromium pattern 12a formed at a region other than the primarily defined region, phase shift layers 15a respectively formed on the side surfaces of the chromium pattern 12a, and second photoshield side walls 18 respectively formed on the side surfaces of the phase shift layers 15a.

Figure 7:
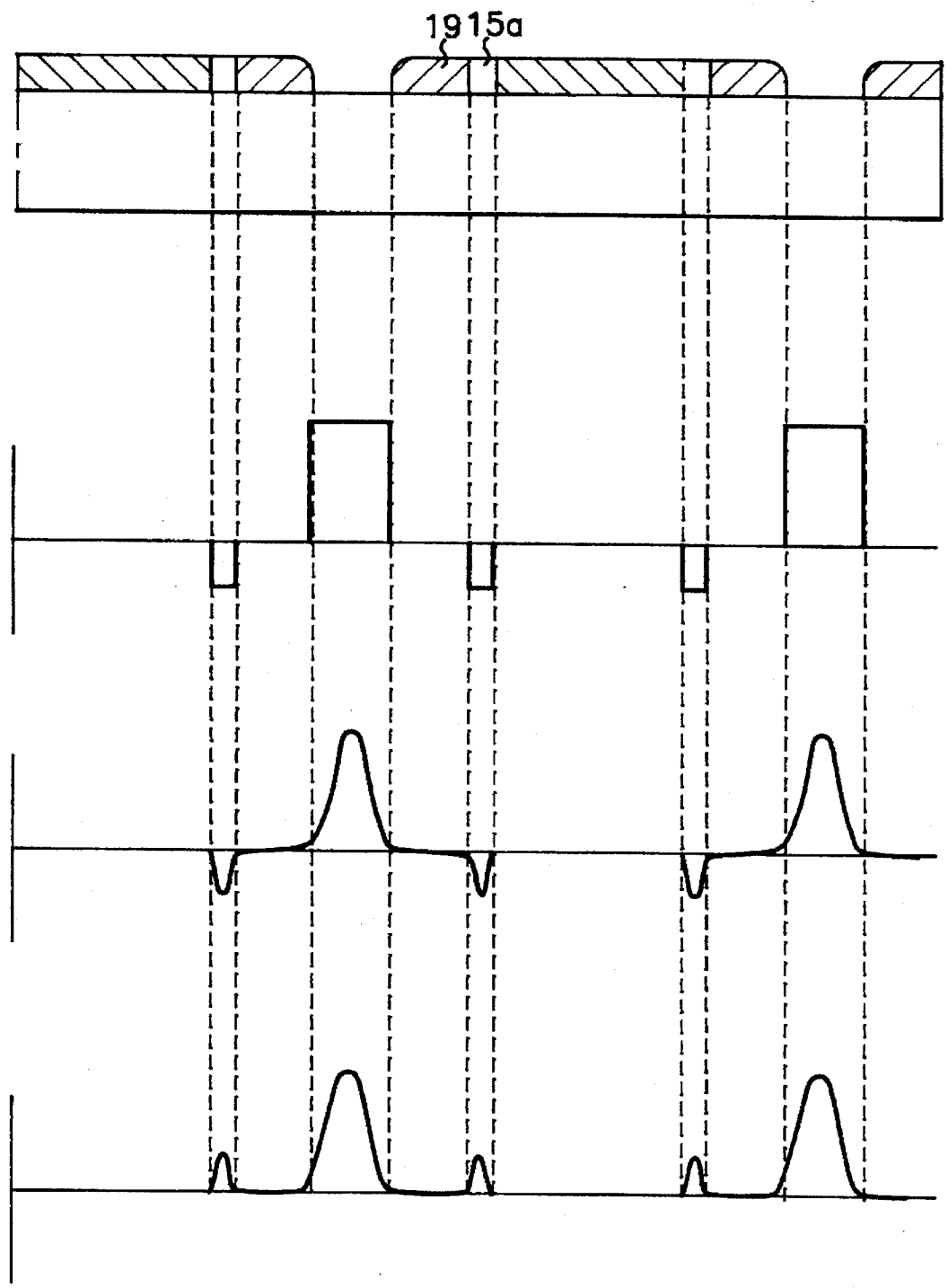
FIG. 7 is a characteristic diagram illustrating the amplitude and intensity of light passing through the phase shift mask in accordance with an embodiment of the present invention.

Amplitude and intensity of light passing through the phase shift mask of the present embodiment are illustrated in FIG. 7.

As apparent from the above description, the embodiments of the present invention provide the following effects.

First, the fabrication of the phase shift mask is simple because it requires no additional masking process using electron beams or the photo lithography for forming the phase shift layer.

Second, more precise semiconductor circuits can be designed because it is possible to determine widths of the regions A, B, B', C and C', depending on the thickness of the deposited photoshield material layer without using the patterning process using electron beams, thereby avoiding patterning error caused by attraction or repulsion occurring among electrons charged up in the photoresist film for electron beams upon the electron beam exposure.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a phase shift mask, comprising the steps of:

depositing a first photoshield layer and a first optional layer over a substrate;

defining a main region including a transmission area, a phase shifting area and a second photoshield area;

selectively removing portions of the first photoshield layer and first optional layer respectively disposed at predetermined regions defined by said main region;

depositing a phase shift layer over said first optional layer and said substrate;

selectively removing said phase shift layer to form phase shift side walls at edges of said main region;

depositing, over said substrate, said phase shift side walls and said first optional layer, a second optional layer having a planarized surface and selectively removing said second optional layer such that both upper surfaces of said first optional layer and said phase shift layer are sufficiently exposed;

completely etching said first optional layer and etching back said phase shift side walls to be flush with said first photoshield layer to form an etched phase shift layer; and depositing a second photoshield layer over said etched phase shift layer, and etching back said second photoshield layer to form photoshield side walls extending from said etched phase shift layer.

2. A method in accordance with claim 1, wherein said first photoshield layer has a height (d) determined depending on a refractive index (n) of the said etched phase shift layer and a wavelength ($\lambda$) of light to be used for a light exposure, said height of said first photoshield layer satisfies the following equation:

$$d=\lambda/2(n-1).$$

3. A method in accordance with claim 1, wherein said second optional layer comprises a photoresist film.

4. A method in accordance with claim 1, wherein said second photoshield layer includes either an amorphous polysilicon layer or a tungsten layer formed using a low pressure chemical vapor deposition.

5. A method in accordance with claim 1, wherein said second optional layer is etched back to have a height identical to a height of said first photoshield layer.

6. A method in accordance with claim 1, wherein said etched phase shift layer, said second photoshield layer and said transmission area have a width ratio of 1:3:3.

7. A method in accordance with claim 1, wherein said first optional layer comprises a phase shift material layer.

8. A method in accordance with claim 4, wherein said first photoshield layer includes a chromium layer.

9. A method in accordance with claim 1, wherein said second optional layer comprises a photoresist film.

10. A method in accordance with claim 1, wherein said second optional layer has an etch selectivity higher than etch selectivities of said first photoshield layer, said first optional layer and said phase shift layer.

11. A method in accordance with claim 1, wherein said transmission area comprises phase shifting regions.

12. A method for fabricating a phase shift mask, comprising:

patterning a first photoshield layer on a substrate;

depositing a phase shift layer over said first photoshield layer and said substrate;

patterning said phase shift layer to form side wall phase shift spacers at edges of said first photoshield layer; and forming a second photoshield layer over said substrate, said second photoshield layer extending from said side wall phase shift spaces to form side wall photoshield spacers at edges of said side wall phase shift spacers.

13. A method in accordance with claim 12, wherein said step of patterning said phase shift layer includes the steps of:

forming a second optional layer on said first photoshield layer and said phase shift layer, and selectively removing said second optional layer and said phase shift layer.

14. A method in accordance with claim 13, wherein said step of patterning the first photoshield layer includes the steps of:

forming the first photoshield layer on the substrate, forming a first optional layer on the first photoshield layer, and removing portions of said first optional layer and said first photoshield layer.

15. A method in accordance with claim 14, wherein said side wall phase shift spacers define sub-patterns in a transmission region and said side wall photoshield spacers define main patterns in said transmission region.

16. A method in accordance with claim 14, wherein widths of said side wall phase shift spacers, said second photoshield layer and said side wall photoshield spacers have a ratio of 1:3:3.

17. A method in accordance with claim 12, wherein said first photoshield layer comprised of a chromium.

18. A method in accordance with claim 17, wherein said second photoshield layer is comprised of either a tungsten or amorphous silicon.

* * * * *